US00RE38043E

(19) United States
(12) Reissued Patent
Shinohara et al.

(10) Patent Number: US RE38,043 E
(45) Date of Reissued Patent: Mar. 25, 2003

(54) LEAD FRAME

(75) Inventors: Toshiaki Shinohara, Tokyo (JP); Yoshiharu Takahashi, Tokyo (JP)

(73) Assignee: Mitsubishi Denki Kabushiki Kaisha, Tokyo (JP)

(21) Appl. No.: 09/517,748

(22) Filed: Mar. 3, 2000

Related U.S. Patent Documents

Reissue of:
(64) Patent No.: 5,872,394
Issued: Feb. 16, 1999
Appl. No.: 08/708,706
Filed: Sep. 5, 1996

(30) Foreign Application Priority Data

Mar. 6, 1996 (JP) ..... 8-049010

(51) Int. Cl.[7] ..... H01L 23/495
(52) U.S. Cl. ..... 257/666; 257/670; 257/671
(58) Field of Search ..... 257/666, 670, 257/671, 702

(56) References Cited

U.S. PATENT DOCUMENTS 4,597,816 A * 7/1986 Barnhart ..... 257/671
5,294,827 A * 3/1994 McShane ..... 257/666
5,336,927 A * 8/1994 Suetake ..... 257/666

FOREIGN PATENT DOCUMENTS

| | | | |
|---|---|---|---|
| JP | 62-229864 | * | 3/1987 |
| JP | 297051 | * | 4/1990 |
| JP | 3129872 | * | 6/1991 |
| JP | 637244 | * | 2/1994 |

* cited by examiner

*Primary Examiner*—Roy Potter
(74) *Attorney, Agent, or Firm*—Leydig, Voit & Mayer, Ltd.

(57) ABSTRACT

In a lead frame, L-shaped support tapes are applied to inner leads and suspension leads. Ends of the support tapes are overlapped with each other at the suspension leads to form, together, a rectangular ring shape. Since the support tapes are L-shaped, when the overlapped portions are positioned at the suspension leads, there are only two overlapped portions of the support tapes at the suspension leads. Thus, the number of overlapped portions requiring accurate alignment is reduced. Moreover, the L-shaped support tapes can be cut from the material for the support tape with higher efficiency.

22 Claims, 21 Drawing Sheets

LEAD FRAME

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a leadframe included is a resin-sealed semiconductor device.

2. Description of the Background Art

When a resin-sealed semiconductor device, for example, fabricated, a leadframe is prepared to mount a semiconductor element (chip) thereon.

FIG. 18 is a perspective view showing a configuration of a background-art leadframe 100. A metal sheet is processed to form the leadframe 100. The leadframe 100 has a pad 2 for mounting the semiconductor element 3 at its center portion, which is supported by suspension leads 6a to 6d from four directions. Inner leads 5 radially extend from the periphery towards the pad 2. The inner leads 5 are connected b electrode portions of the semiconductor element 3 with metal thin wires 4.

After the leadframe 100 in the state of FIG. 18 is obtained, the semiconductor element 3 is sealed in resin such as epoxy resin and the inner leads 5 and the suspension leads 6a to 6d are cut off from the leadframe 100.

In a case of a semiconductor package which includes a larger number of inner leads 5, such as a multiple pin QFP (Quad Flat Package), each inner lead 5 becomes narrower sad longer and its rigidity becomes lower. To prevent deformation of such inner lead 5 in a fabricating process, a support tape is applied to the inner leads 5 and the suspension leads 6a to 6d. As to the support tape, a variety of forms are proposed as below.

FIG. 18 shows a rectangular ring-shaped support tape 201. The rectangular ring-shaped support tape 201 is applied to the inner leads 5 and the suspension leads 6a to 6d around the pad 2. Since the support tape is rectangular, the inner leads 5 and the suspension leads 6a to 6d are not deformed or displaced even if the support tape 201 contracts.

FIG. 19 is a plan view illustrating a manner of taking the support tape 201 out of its material. The material 200 for the support tape 201 is generally supplied in tape form, and a rectangular ring-shaped support tape 201 is punched and applied to the inner leads 5. In this case, there are remaining portions 202 and 203, and the material 200 is disadvantageously utilized with low efficiency. In general, the material 200 is expensive, and therefore inefficient use of the material 200 leads to a costly leadframe 100.

To solve the problem of the structure of FIG. 18, use of strip shaped support tapes, instead of rectangular ring-shaped support tapes, is proposed. FIG. 20A is a plan view showing a configuration of a leadframe 101 and FIG. 20B is a section taken along the line 20B—20B and viewed from the direction of the arrow of FIG. 20A.

The support tapes 211 and 221 are of strip-shape and applied to all of the inner leads and suspension leads 6a to 6d. FIG. 21 is a plan view illustrating a manner of taking the support tapes 211 and 221 out of their materials 210 and 220 in tape form. The support tapes 211 and 221 can be taken out of the materials 210 and 220 with higher efficiency than in the structure of FIG. 18 since those support tapes are rectangular.

With this type of support tapes, however, the inner leads 5 are deformed at the suspension leads 6a to 6d and their vicinities, e.g., in an area A including the suspension lead 66 and its vicinity. FIG. 22 is as enlarged plan view of an area A and its vicinity of FIG. 20A. Among the inner leads 5, an inner lead 501 adjacent to the suspension lead 6b to which both the support tapes 211 and 221 are applied is pulled in the directions of the arrows by contractions of the support tapes 211 and 221. The inner lead 501 is thereby deformed and comes into contact with an adjacent inner lead 502 at a point B. Then, the suspension lead 6b and the inner lead 502 are also deformed.

To solve the problems of the structure of FIGS. 18 and 20A, it is also proposed that the strip-shaped support tapes 211 and 221 should be applied to the inner leads 5 and the suspension leads 6a to 6d with their end portions overlapped. FIG. 23A is plan view showing a configuration of a leadframe 102 and FIG. 23B is a section taken along the line 23B—23B of FIG. 23A and viewed from the direction of the arrow.

The end portions of the strip-shaped support tapes 211 and 221 are overlapped to form a rectangular ring-shaped support tape on the whole and further their materials 210 and 220 can be utilized with higher efficiency. Moreover, at their overlapped end portions, stresses generated by contraction along the directions of the respective lengths of the support tapes 211 and 221 are balanced and the suspension leads 6a to 6d are given stresses only in a direction towards the pad 2. That avoids deformation of the suspension leads 6a to 6b.

It is not desirable, however, that many portions are each given stresses in different directions at an angle of 90° when the support tapes contract. The reason is the alignment of their end portions to be overlapped should be accurately made in order to balance the stresses applied to the support tapes 211 and 221 along the directions of their lengths.

SUMMARY OF THE INVENTION

The present invention is directed to a leadframe. According to a first aspect of the present invention, the leadframe comprises: a plurality of inner leads provided radially; and a group of support tapes applied to the plurality of inner leads in a ring shape, in which inner end portions of the plurality of inner leads expose on inner peripheral side of the group of support tapes, and in which the group of support tapes includes a plurality of first support tapes of L-shape, and both and portions of one of the plurality of first support tapes are overlapped with end portions of at least one of the plurality of first support tapes which is different from said one of the plurality of first support tapes.

According to a second aspect of the present invention, in the leadframe of the first aspect, the group of support tapes includes two first support tapes.

According to a third aspect of the present invention, the leadframe of the fast aspect further comprises: a pad of substantially rectangular surrounded by the plurality of inner leads, in which the respective center portions of the plurality of first support tapes are located on two opposed ones of four suspension leads which are inner leads for supporting the pad at its four corners.

According to a fourth aspect of the present invention, in the leadframe of the third aspect, one of the plurality of first support tapes is applied to a front surface of the inner leads and the other is applied to a back surface of the inner leads, and the respective end portions are overlapped with each other through the inner leads.

According to a fifth aspect of the present invention, in the leadframe of the second aspect, each of the end portions of the plurality of first support tapes has a chipped portion having an angle of almost 45° in its extending direction.

According to a sixth aspect of the present invention, in the leadframe of the first aspect, the group of support tapes includes four first support tapes.

According to a seventh aspect of the present invention, the leadframe of the sixth aspect further comprises: a pad of substantially rectangular surrounded by the plurality of inner leads, in which the respective center portions of the plurality of first support tapes are located on four suspension leads which are inner leads for supporting the pad at its four corners.

According to an eighth aspect of the present invention, in the leadframe of the seventh aspect, a first pair of the plurality of first support tapes are opposed to each other and a second pair of the plurality of first support tapes are opposed to each other, the first pair and the second pair are different from each other, the first pair is applied to a front surface of the inner leads and the second pair is applied to a back surface of the inner leads, and end portions of the first support tapes are overlapped with adjacent ones through the inner leads.

According to a ninth aspect of the present invention, the leadframe comprises: a plurality of inner leads provided radially; and a group of support tapes applied to the plurality of inner leads in a ring shape, in which inner end portions of the plurality of inner leads expose on inner peripheral side of the group of support tapes; and in which the group of support tapes includes a plurality of first support tapes of L-shape and a plurality of second support tapes of strip-shape, and both end portions of one of the plurality of first support tapes are overlapped with end portions of the plurality of second support tapes.

According to a tenth aspect of the present invention, in the leadframe of the ninth aspect, the plurality of first support tapes are applied to a front surface of the inner leads and the plurality of second support tapes are applied to a back surface of the inner leads, and end portions of the first support tapes are overlapped with end potions of second support tapes through the inner leads.

The leadframe of the first aspect employs L-shaped fast support tapers, and therefore achieves higher efficiency in utilizing the material for support which is generally in tape form.

When the support tapes are overlapped in a portion where stresses may be generated in different directions at an angle of 90°, the overlapping should be made with sufficient accuracy. The leadframe of the second and third aspects needs only two overlapped portions of the support tapes, and therefore the number of then overlapped portions requiring sufficient accuracy in overlapping is reduced.

The leadframe of the fifth aspect employs the first support tapes with end portions each having a chipped portion at an angle of almost 45°, and therefore makes it possible to take the first support tape having longer sides out of the material for support tape. That allows standardization of width of the material for support tape for a variety of leadframes of different sizes, and thereby facilitates an abundant supply of materials for support tapes of few kinds, resulting in a lower price of the material for support tape.

Although the leadframe of the sixth and seventh aspects needs four overlapped potions of the support tapes, no stress in different directions at an angle of 90° is generated at the overlapped portions. Therefore, the leadframe has no overlapped portion requiring sufficient accuracy in overlapping.

The second support tapes used in the leadframe of the ninth aspect are of strip-shape, and therefore can be taken oat of the material for support tape with much higher efficiency. Moreover, since the second support tape is interposed between the first support tapes, it is possible to standardize width of the material for support tape for a variety of leadframes of different sizes, even for a larger leadframe regardless of the extent of the enlargement. That facilitates an abundant supply of materials for support tapes of few kinds, resulting in a lower price of the material for support tape.

The leadframe of the fourth, eighth and tenth aspects has no overlapped portion of any two support tapes on its front surface, and therefore suppresses degradation of accuracy in resin-sealing.

An object of the present invention is to reduce the number of overlapped portions of the support tapes where the stresses are generated in different directions at an angle of 90°, for reduction in the number of portions requiring accurate alignment in overlapping, and further to suppress deformation of an inner lead at a low cost by using the support tape which can be taken out of the material with higher efficiency.

These and other objects features, aspects and advantages of the present invention will become more apparent from the following detailed description of the present invention when taken is conjunction with the accompanying drawings.

DESCRIPTION OF THE PREFERRED EMBODIMENTS

The First Preferred Embodiment

Figures 1A, 1B:
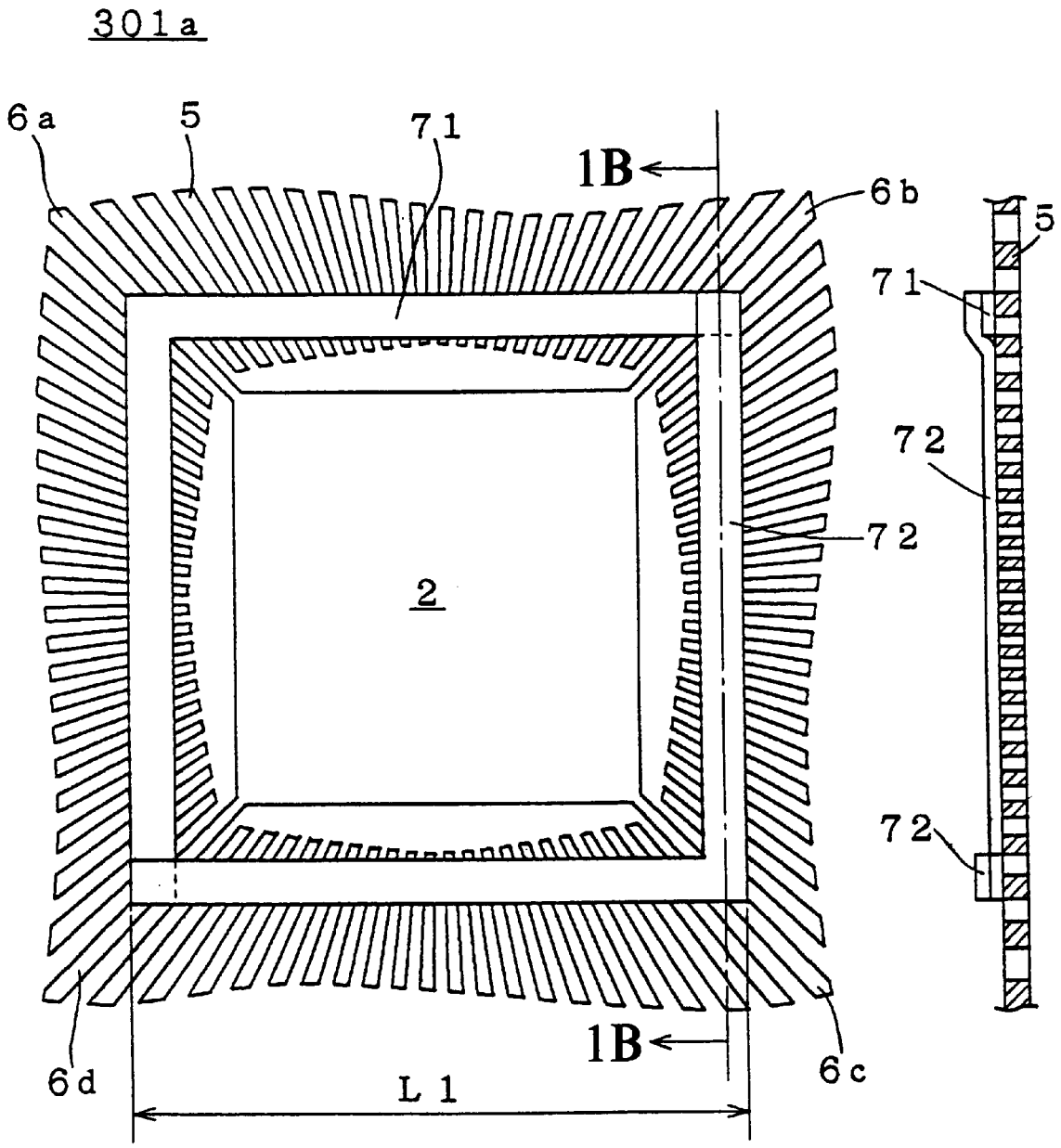
FIGS. 1A and 1B are a plan view and a n along the line 1A—1A and viewed from the direction of the arrow, respectively, showing a configuration of a leadframe in accordance with a first preferred embodiment of the present invention.

FIG. 1A is plan view of a leadframe 301a is accordance with the first preferred embodiment of the present invention and FIG. 1B is a section taken along the 1B—1B of FIG. 1A and viewed from the direction of the arrow.

In the leadframe 301a, L-shaped support tapes 71 and 72 are applied to the inner leads 5 and the suspension leads 6a to 6d. End portions of the support tapes 71 and 72 are overlapped with each other at the upper-right suspension lead 6b and the lower-left suspension lead 6d and their vicinities, and thus these two support tapes form together a rectangular ring shaped. That avoids the problem of the second background art structure that the inner leads 5 and the suspension leads 6a to 6d are deformed.

Moreover, since the support tapes 71 and 72 are L-shaped, their center portions and their vicinities are positioned at the suspension leads 6a and 6c and their vicinities, respectively, and there are only two overlapped end portions of the support tapes 71 and 72 at the suspension leads 6b and 6d. Thus, the overlapped portions at the suspension leads and their vicinities are reduced in number by two as compared with those in the third background art structure, and the necessity for accurate alignment is thereby suppressed.

Furthermore, as to the material efficiency which is the problem in the first background art structure, an improvement as discussed below is achieved.

Figure 2:
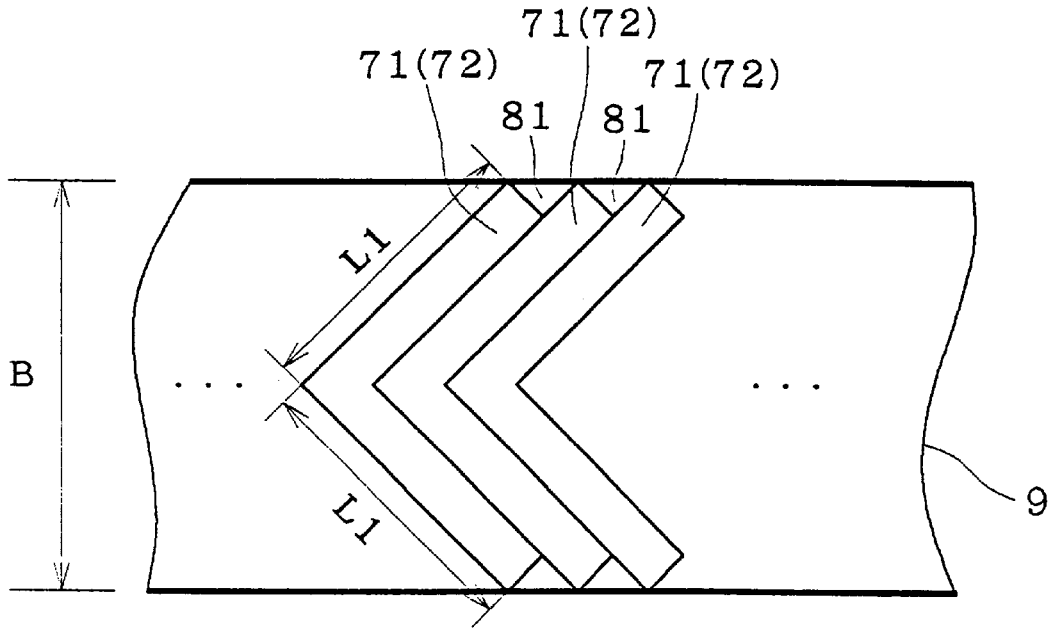
FIG. 2 is a plan view showing a manner of taking support tapes out of a material for support tape.

FIG. 2 is a plan view illustrating a manner of taking the support tapes 71 and 72 out of the material 9. The material 9 is of tape form with a width B. If each outer side of the rectangular ring-shape which is formed of the support tapes 71 and 72 shown in FIG. 1 has a length L1, the support tapes 71 (72) are arranged to be adjacent to each other in a direction of the length of the material 9 (perpendicular to the direction of its width). By obtaining the support tapes 71 (72) in this manner, the remaining portions 81 of the material 9 are reduced.

Figure 3:
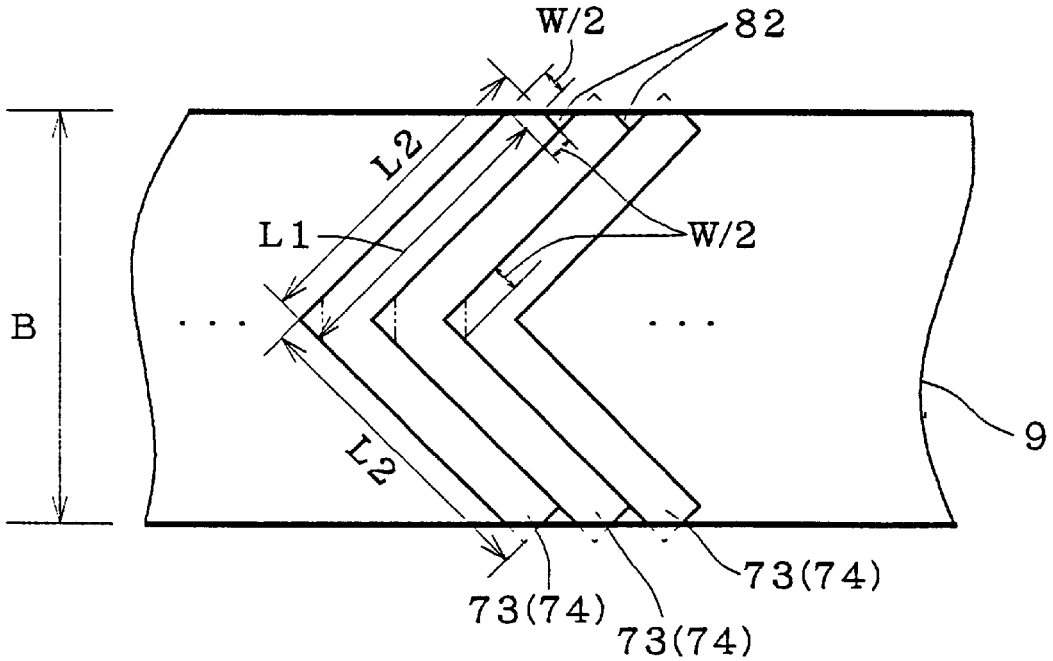
FIG. 3 is a plan view showing a manner of taking support tapes out of a material for support tape.

The remaining portions of the material 9 can be further reduced. FIG. 3 is a plan view illustrating a manner of taking the L-shaped support tapes 73 and 74 out of the material 9. If the support tapes 73 and 74 each have a width W, a pattern of adjacent L-shaped support tapes 73 (74) is made so that isosceles triangles whose shorter sides each have a length W/2 may extend off the material 9. In this case, each remaining portion 82 is an isosceles triangle whose shorter sides each have a length W/2 and is smaller in area than the remaining portion 81 which is an isosceles triangle whose shorter sides each have a length W. Thus, the material 9 is utilized with higher efficiency.

In this case, both end portions of each support tape 73 (74) are actually missing an isosceles triangular area whose shorter sides each have a length W/2. Nevertheless, the support tapes 73 and 74 can be overlapped with each other.

Figures 4A, 4B:
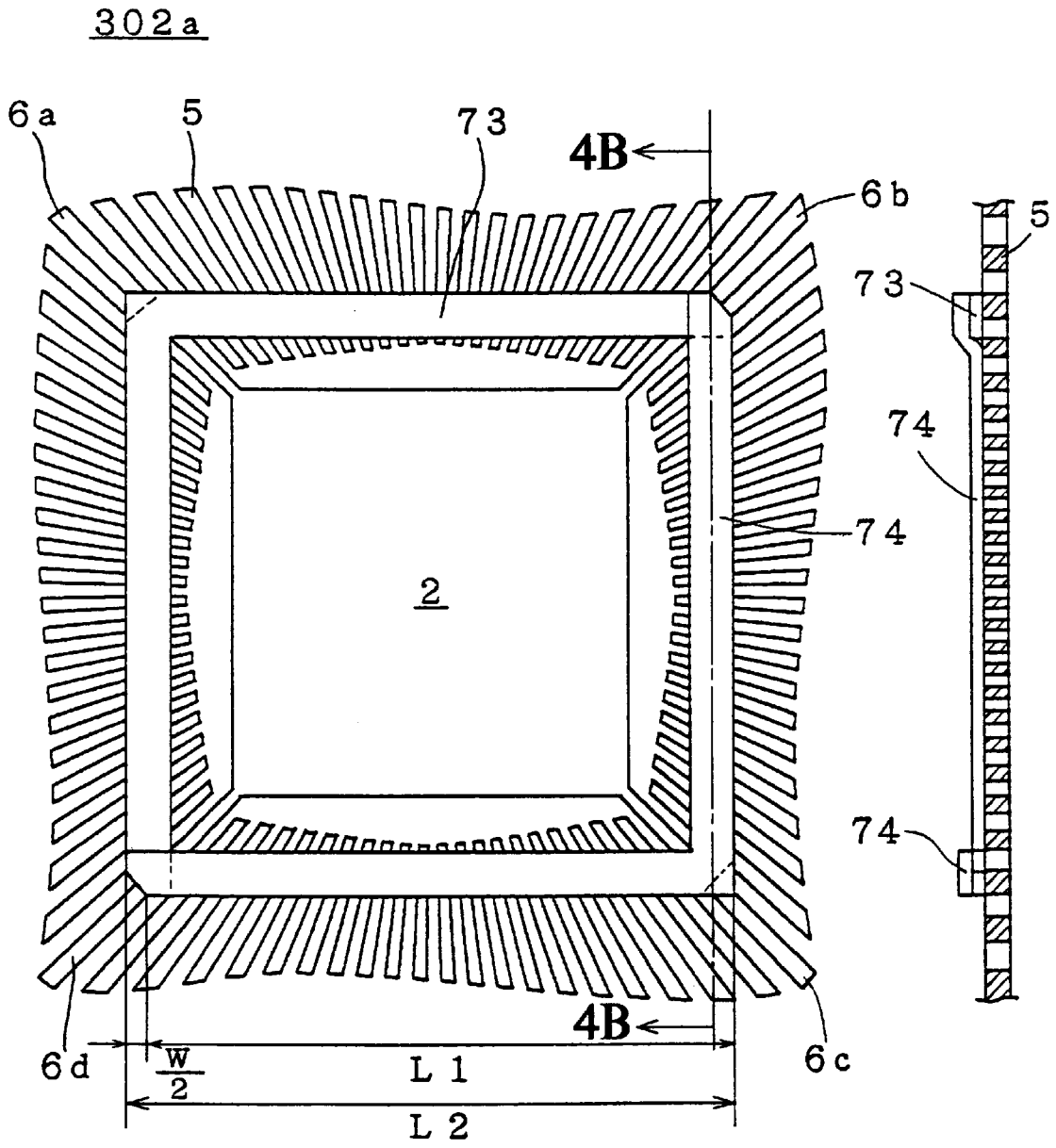
FIGS. 4A and 4B are a plan view and a section taken along the line 4B—4B and viewed from the direction of the arrow, respectively, showing a configuration of a leadframe in accordance with the first preferred embodiment of the present invention.

FIG. 4A is plan view of a leadframe 302a on which end portions of the support tapes 73 and 74 are overlapped at the upper right suspension lead 6b and the lower-left suspension lead 6d and their vicinities. FIG. 4B is a section taken along the line 4B—4B of FIG. 4A and viewed from the direction of the arrow.

In these figures, the end portions of the support tapes 73 and 74 are overlapped is a pentagon which corresponds to a square whose sides each have a length W with a missing portion having an isosceles triangular area whose shorten sides each have a length W/2. That makes a rectangular ring-shape which is formed of the support tapes 73 and 74 with longer outer sides each of which has a length L2=L1+(W/2), while keeping a balance of stresses.

In other words, the material 9 having a width to can be used for leadframes of different sizes. For a variety of semiconductor devices of different sins, standardization of the size of the materials for the support tape can be easily achieved That facilitates as abundant supply of materials for support tapes of few kinds, resulting in a lower price of the material for the support tape. Thus, the support tape can be made available at a still lower cost.

Figure 5:
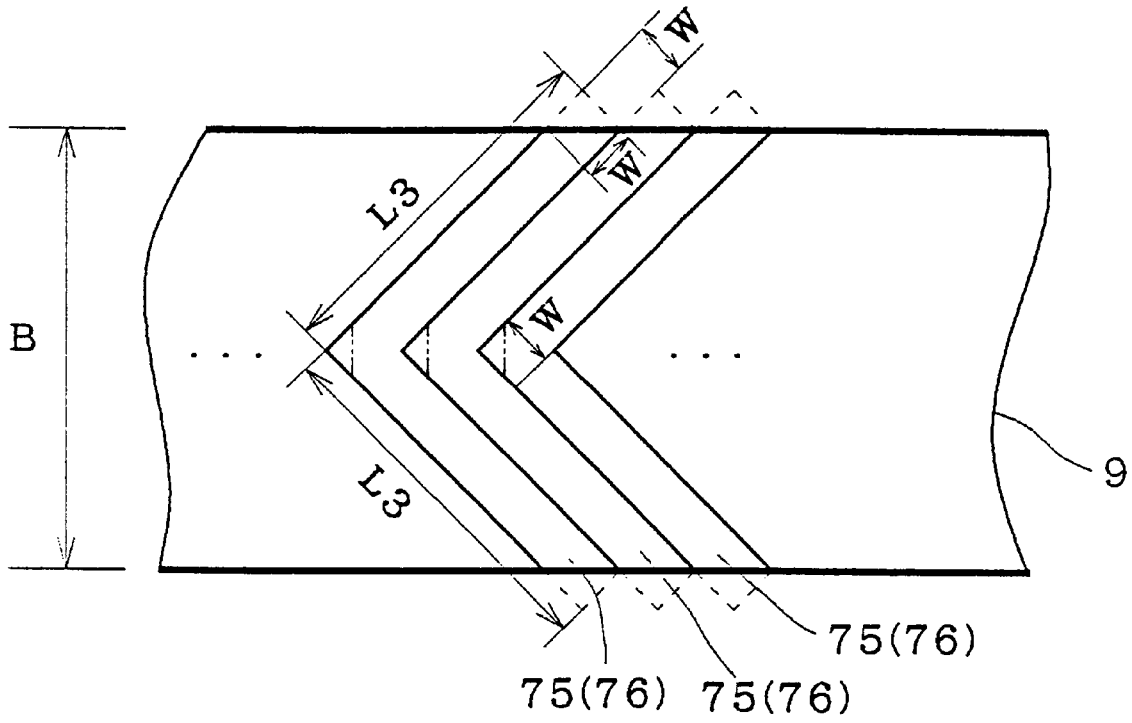
FIG. 5 is a plan view showing a manner of taking support tapes out of a material for support tape.

The remaining portion of the material 9 can be further reduced is area. FIG. 5 is a plan view illustrating a manner of taking the support tapes 75 and 76 out of the material 9. If the support tapes 75 and 76 each have a width W, a pattern of adjacent L-shaped support tapes 75 (76) is made so that isosceles triangles whose shorter sides each have a length W may extend off the material 9. In this case, no remaining portion is left and the material 9 is utilized with maximum efficiency.

In this case, both end portions of each support tape 75 (76) are actually missing an isosceles triangle whose shorter sides each have a length W. Nevertheless, the support tapes 75 and 76 can be overlapped with each other.

Figures 6A, 6B:
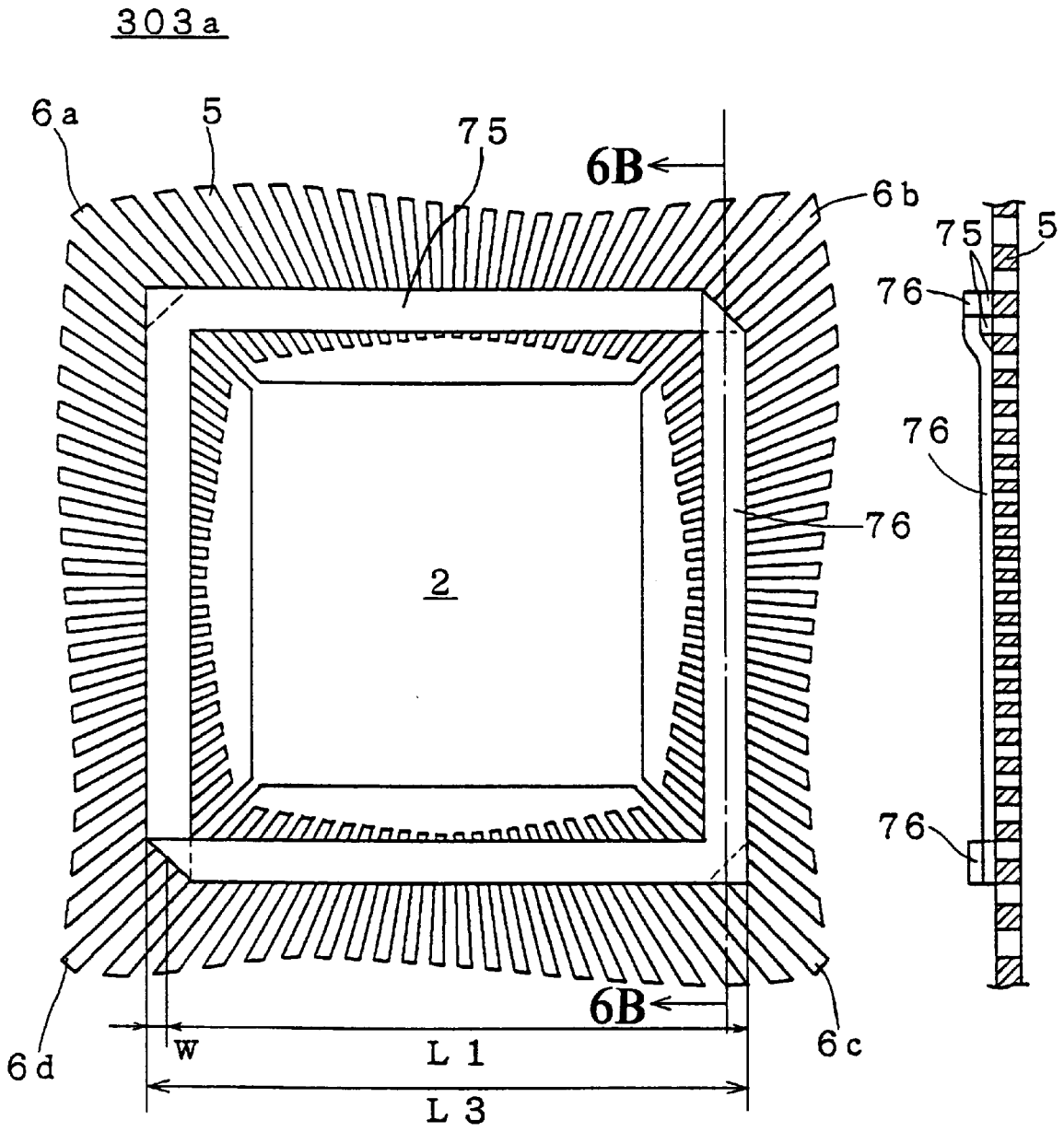
FIGS. 6A and 6B are a plan view and a section taken along the line 6A—6A and viewed from then direction of the arrow, respectively, showing a configuration of a leadframe in accordance with the first preferred embodiment of the present invention.

FIG. 6A is plan view of a leadframe 303a on which end portions of the support tapes 75 and 76 are overlapped at the upper-right suspension lead 6b and the lower-left suspension lead 6d and their vicinities. FIG. 6B is a section taken along the one-dot chain line 6B—6B of FIG. 6A and viewed from the direction of the arrow.

In these figures, the end portions of the support tapes 75 and 76 are overlapped in an isosceles triangle whose shorter sides each have a length W. That makes a rectangular ring-shape which is formed of the support tapes 75 and 76 with still longer outer sides each of which has a length L3=L1+W, while keeping a balance of stresses.

Figures 7A, 7B:
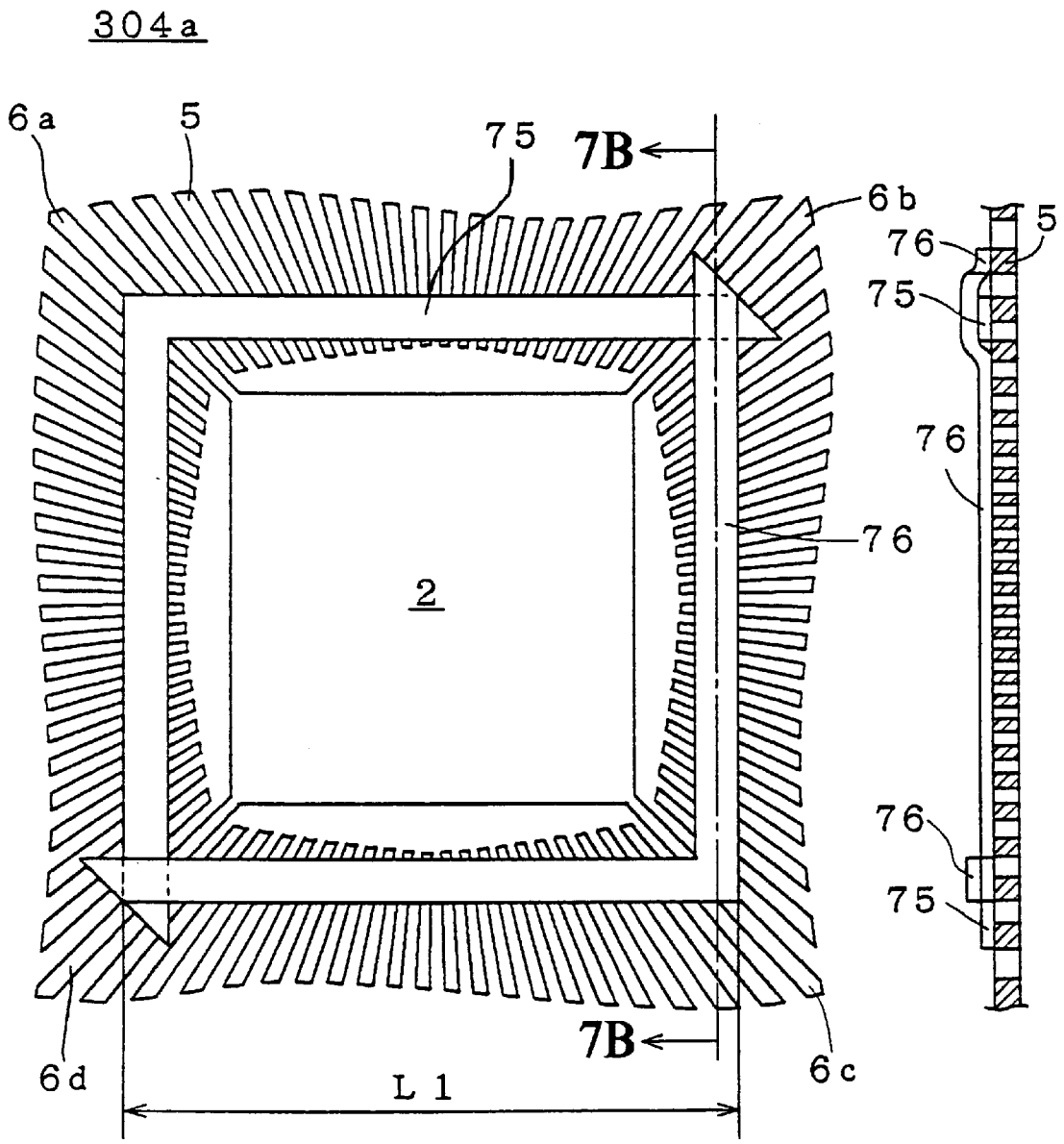
FIGS. 7A and 7B are a plan view and a section taken along the line 7A—7A and viewed from the direction of the arrow, respectively, showing a configuration of a leadframe in accordance with the first preferred embodiment of the present invention.

It is naturally possible to make a rectangular ring-shape with shorter outer sides. FIG. 7A is plan view of a leadframe 304a on which end portions of the support tapes 75 and 76 are overlapped extending off each other at the upper-right suspension lead 6b and the lower-left suspension lead 6d and their vicinities. FIG. 7B is a section taken along the 7A—7A of FIG. 7A and viewed from the direction of the arrow.

In these figures, the end portions of the support tapes 75 and 76 art overlapped in a square with sides each having a length W. That makes a rectangular ring-shape which is formed of the support tapes 75 and 76 with outer sides each of which has a length L1.

This means that the material for support tape is utilized with still higher efficiency while facilitating standardization of size of the materials for support tape for a variety of semiconductor devices of different sizes without any hindrance.

As indicated by double dashed lines in FIGS. 3, 4, 5 and 6, the center portion of the L-shaped support tape may be intentionally cut off for uniformity in the shape of the overlapped portions.

The Second Preferred Embodiment

Figure 8A:
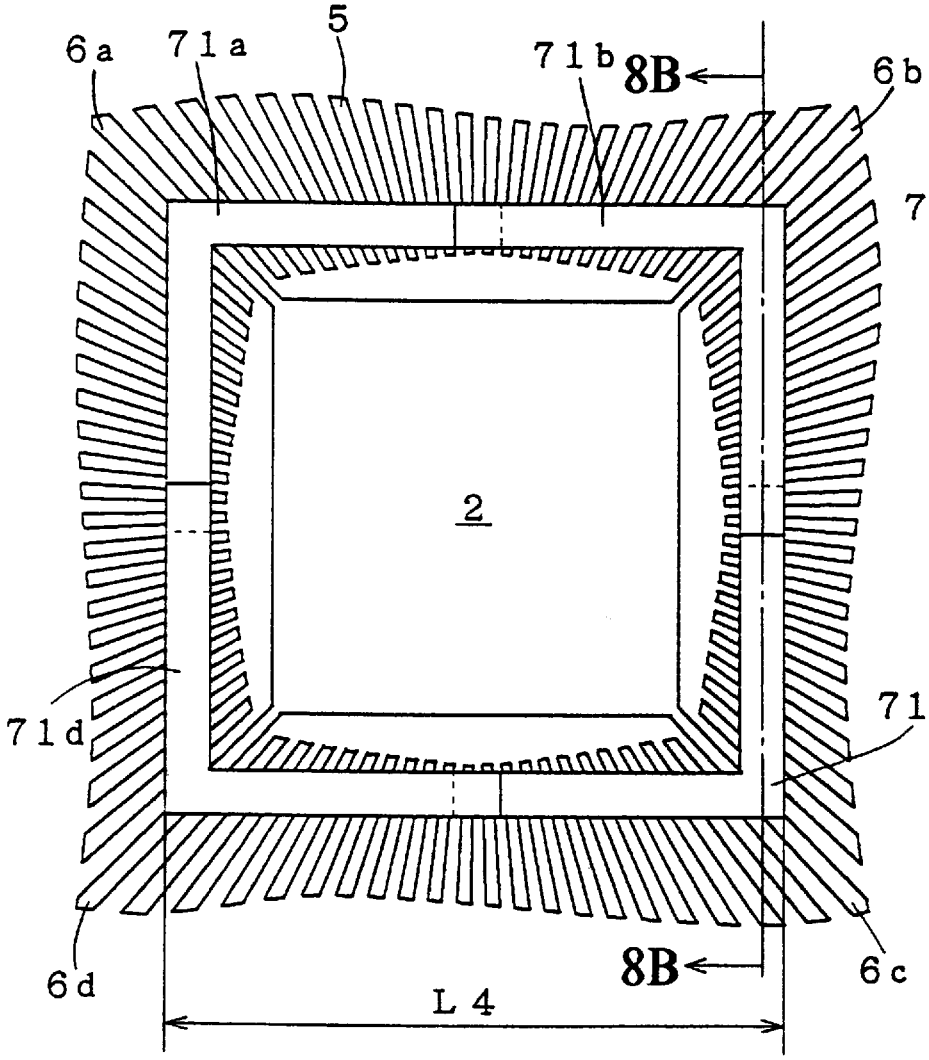
FIGS. 8A and 8B are a plan view and a section taken along the line 8A—8A and viewed from the direction of the arrow, respectively, showing a configuration of a leadframe in accordance with a second preferred embodiment of the present invention.
Figure 8B:
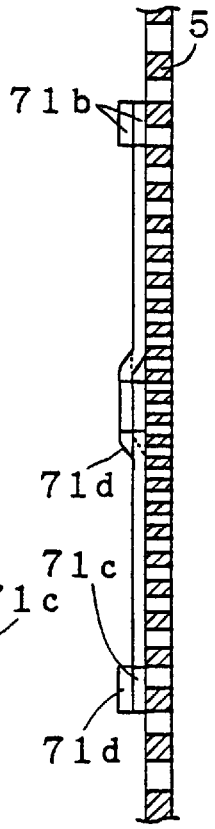

FIG. 8A is plan view of a leadframe 305a in accordance with the second preferred embodiment of the present invention and FIG. 8B is a section taken along the line 8A—8A of FIG. 8A and viewed from the direction of the arrow.

The support tapes 71a to 71d are of L-shaped like the support tapes 71 (72) discussed in the fast preferred embodiment. The corner portions of the support tapes 71a to 71d are positioned and applied to the upper-left suspension lead 6a, the upper-right suspension lead 6b, the lower-right suspension lead 6c and the lower-left suspension lead 6d respectively and their vicinities. One end portion of the support tape 71a is overlapped with one end portion of the support tape 71b and the other end portion is overlapped with one end portion of the support tape 71d. Similarly, one end portion of the support tape 71c is overlapped with the other end portion of the support tape 71b and the other end portion is overlapped, with the other end portion of the support tape 71d.

Thus, since the support tapes are overlapped on some of the inner leads 5 other than those in the vicinity of the suspension leads 6a to 6d, stresses caused by contraction of the support tapes are prevented from being applied to the overlapped portico from different directions at an angle of 90°. Thus, in the second preferred embodiment, it is desirably possible to further reduce the number of the overlapped portions to which the stresses are applied from different directions at an angle of 90° as compared with those in the first preferred embodiment.

Furthermore, if the support tape 71a (71b, 71c, 71d) has a length L1, a rectangular ring-shaped pattern which is formed of the support tapes 71a to 71d with sides each of which has a length L4=2·L1−D (where D represents a length of an overlapped portion) is applied to the inner leads 5 and the suspension leads 6a to 6d. Thus, advantageously, the present invention can be applied to a leadframe which is larger, regardless of the extent of the enlargement.

The Third Preferred Embodiment

Figures 9A, 9B:
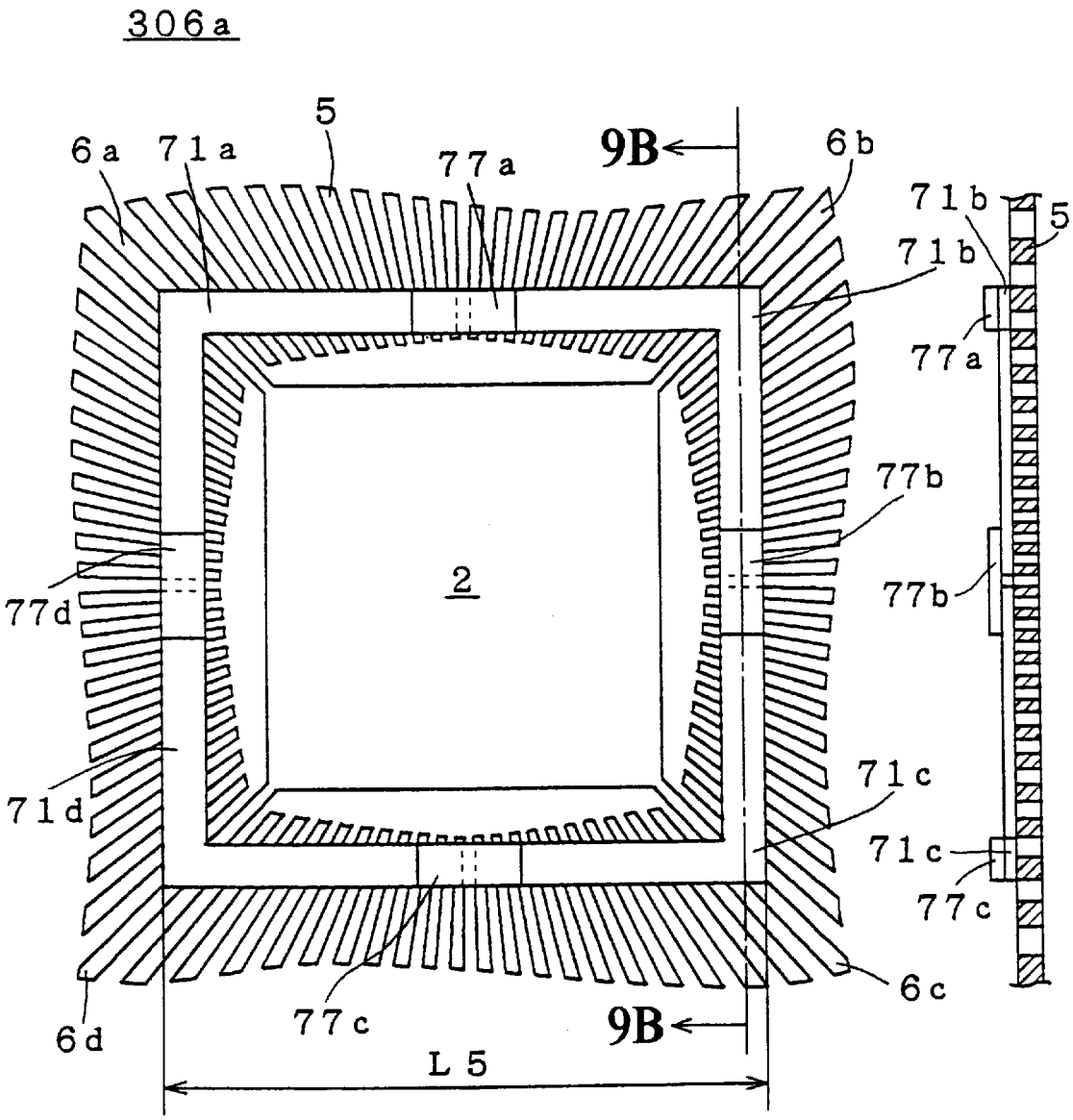
FIGS. 9A and 9B are a plan view and a section taken along the liner 9A—9A and viewed from the direction of the arrow, respectively, showing a configuration of a leadframe in accordance: with a third preferred embodiment of the present invention.

FIG. 9A is plan view of a leadframe 306a in accordance with the third preferred embodiment of the present invention and FIG. 9B is a section taken along the line 9A—9A of FIG. 9A and viewed from the direction of the arrow.

Like the second preferred embodiment, the corner portions of the L-shaped support tapes 71a to 71d are positioned and applied to the upper-left suspension lead 6a, the upper-right suspension lead 6b, the lower-right suspension lead 6c and the lower-left suspension lead 6d, respectively, and their vicinities. An end portion of the L-shaped support tape 71a and that of the L-shaped support tape 71b are overlapped with opposite end portions of the strip-shaped support tape 77a, respectively. Similarly, the other end portion of the L-shaped support tape 71b and an end portion of the L-shaped support tape 71c are overlapped with opposite end portions of the strip-shaped support tape 77b, respectively, the other end portion of the L-shaped support tape 71c and an end portion of the L-shaped support tape 71d are overlapped with opposite end portions of the strip-shaped support tape 77c, respectively, and the other end portion of the L-shaped support tape 71d and that of the L-shaped support tape 71a are overlapped with opposite end portions of the strip-shaped support tape 77d, respectively.

Thus, the present invention can be applied to a still larger leadframe while achieving an advantage of no overlapped portion to which the stresses are applied from different directions at an angle of 90°, like the second preferred embodiment. Specifically, a rectangular ring-shaped pattern with sides each of which has a length L5=2·L1+K−2/D (where K represents the length of each support tape 77a (77b, 77c and 77d) ) is achieved.

Figures 10A, 10B:
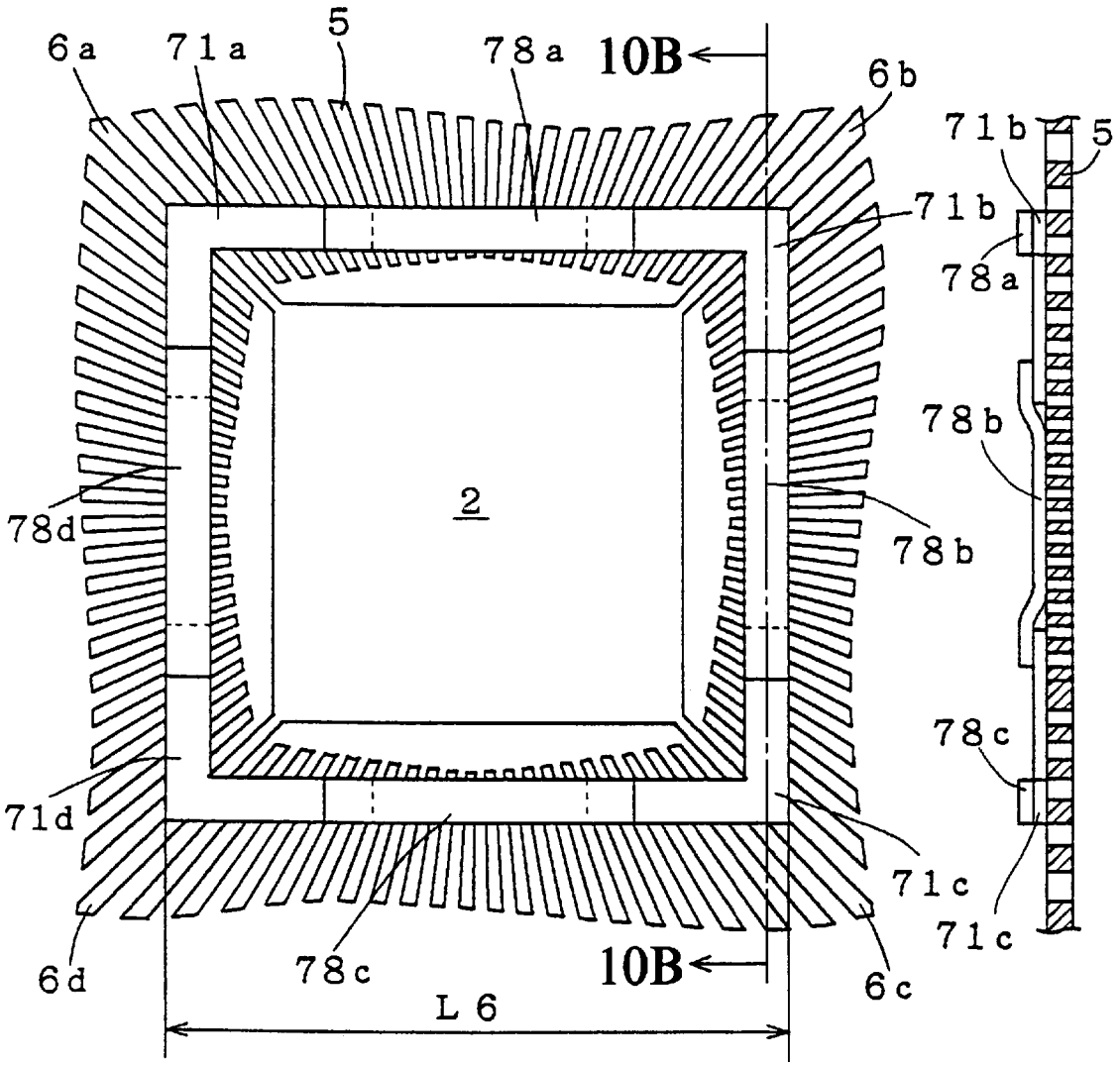
FIGS. 10A and 10B are a plan view and a section taken along the line 10A—10A and viewed from tire direction of tire arrow, respectively, showing a configuration of a leadframe in accordance with the third preferred embodiment of the present invention.
Figures 11A, 11B:
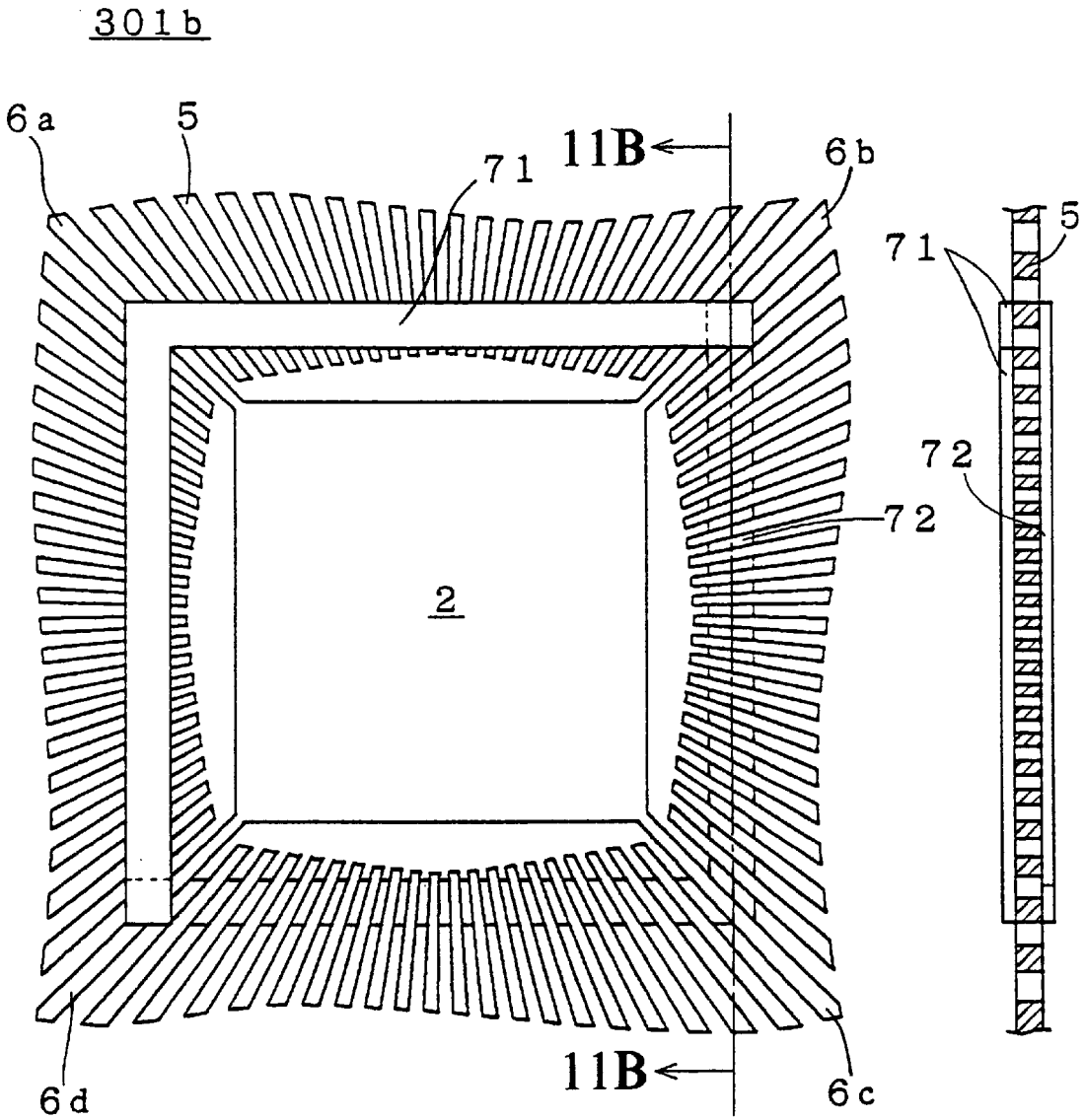
FIGS. 11A and 11B are a plan view and a section taken along the line 11A—11A and viewed from the direction of the arrow, respectively, showing a configuration of a leadframe in accordance with a fourth preferred embodiment of the present invention.
Figures 12A, 12B:
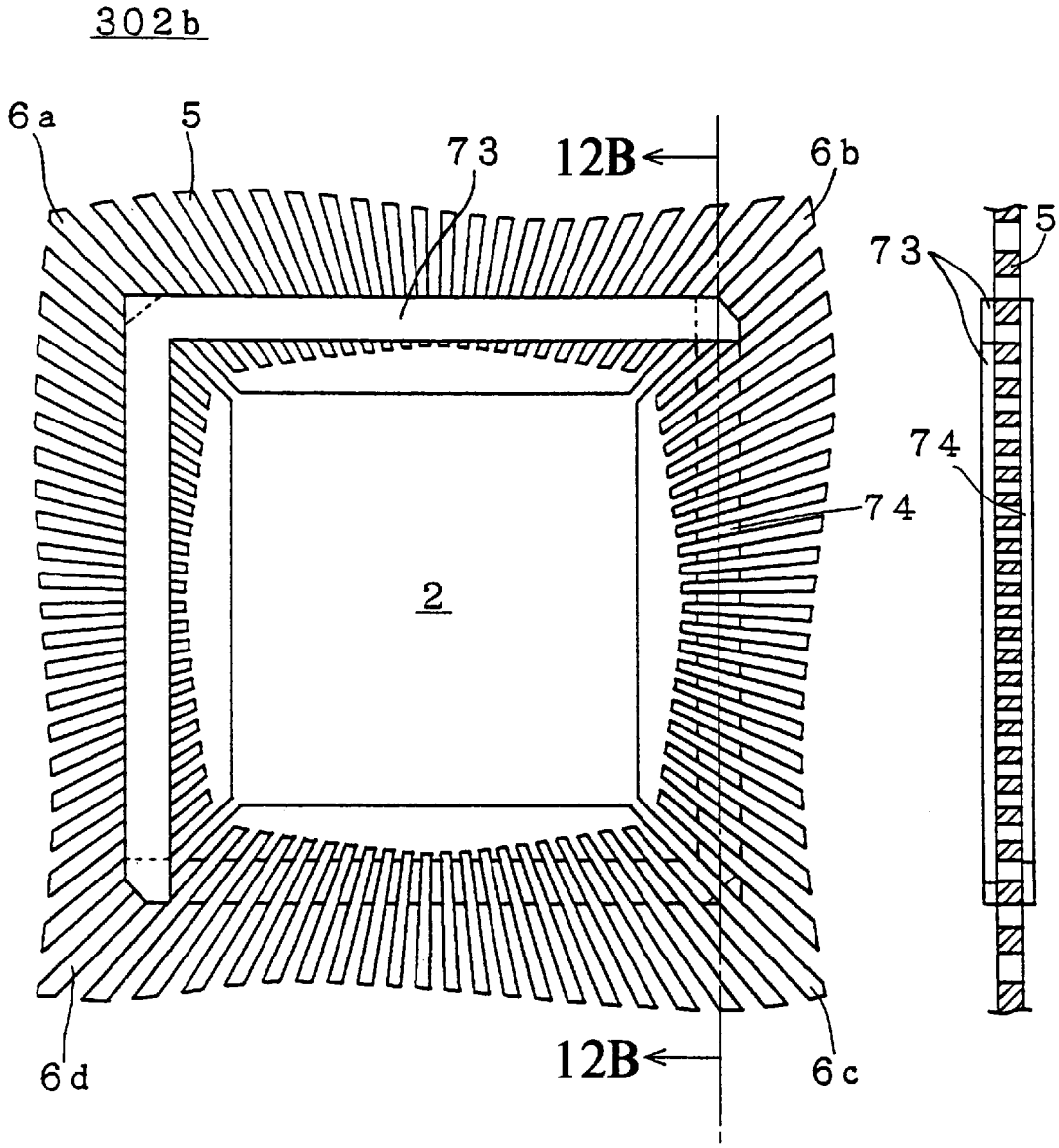
FIGS. 12A and 12B are a plan view and a section taken along the line 12A—12A and viewed from the direction of the arrow, respectively, showing a configuration of a leadframe in accordance with the fourth preferred embodiment of the present invention.
Figures 13A, 13B:
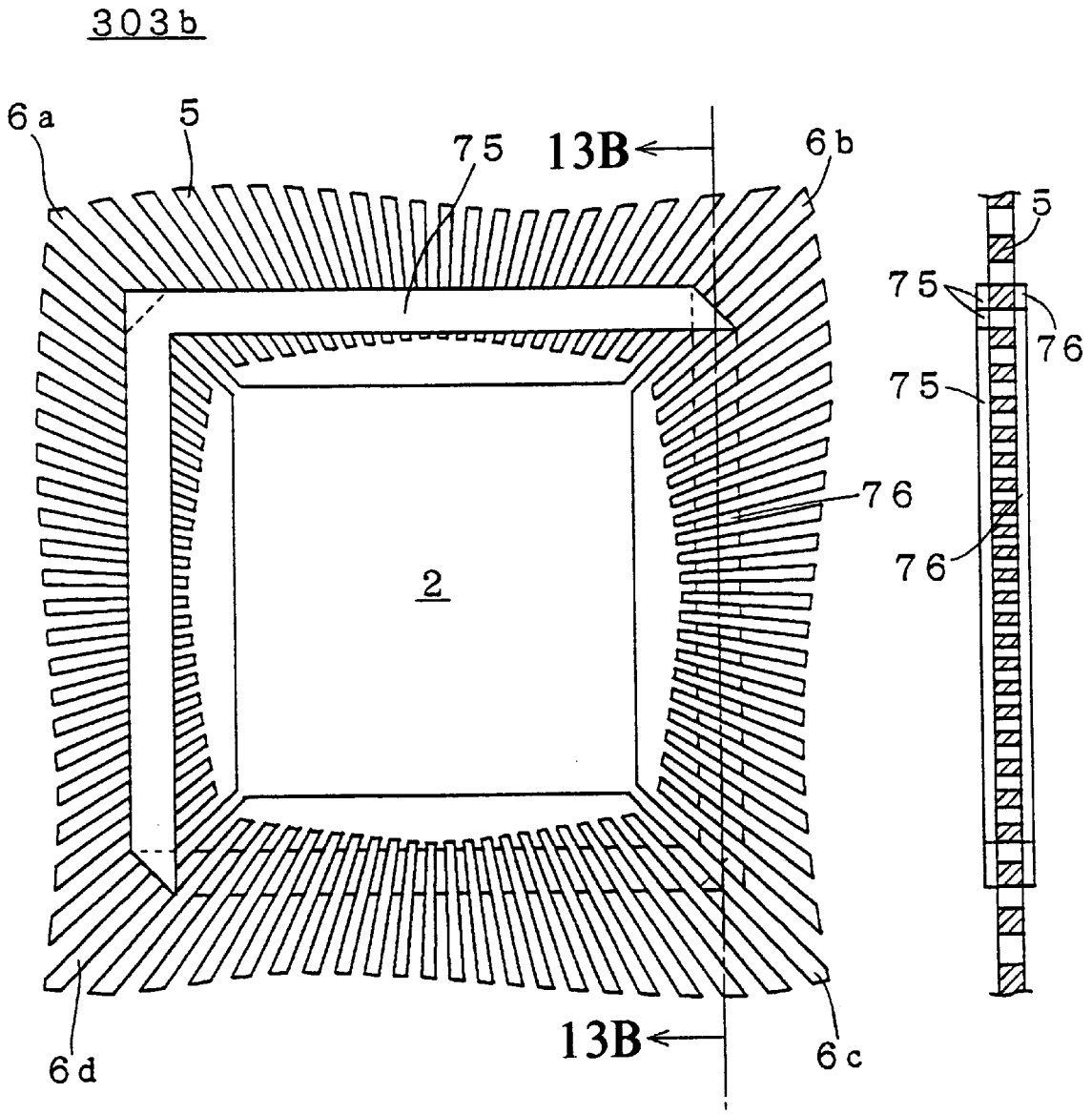
FIGS. 13A and 13B are a plan view and a section taken along the line 13A—13A and viewed from the direction of the arrow, respectively, showing a configuration of a leadframe in accordance with the fourth preferred embodiment of the present invention.
Figures 14A, 14B:
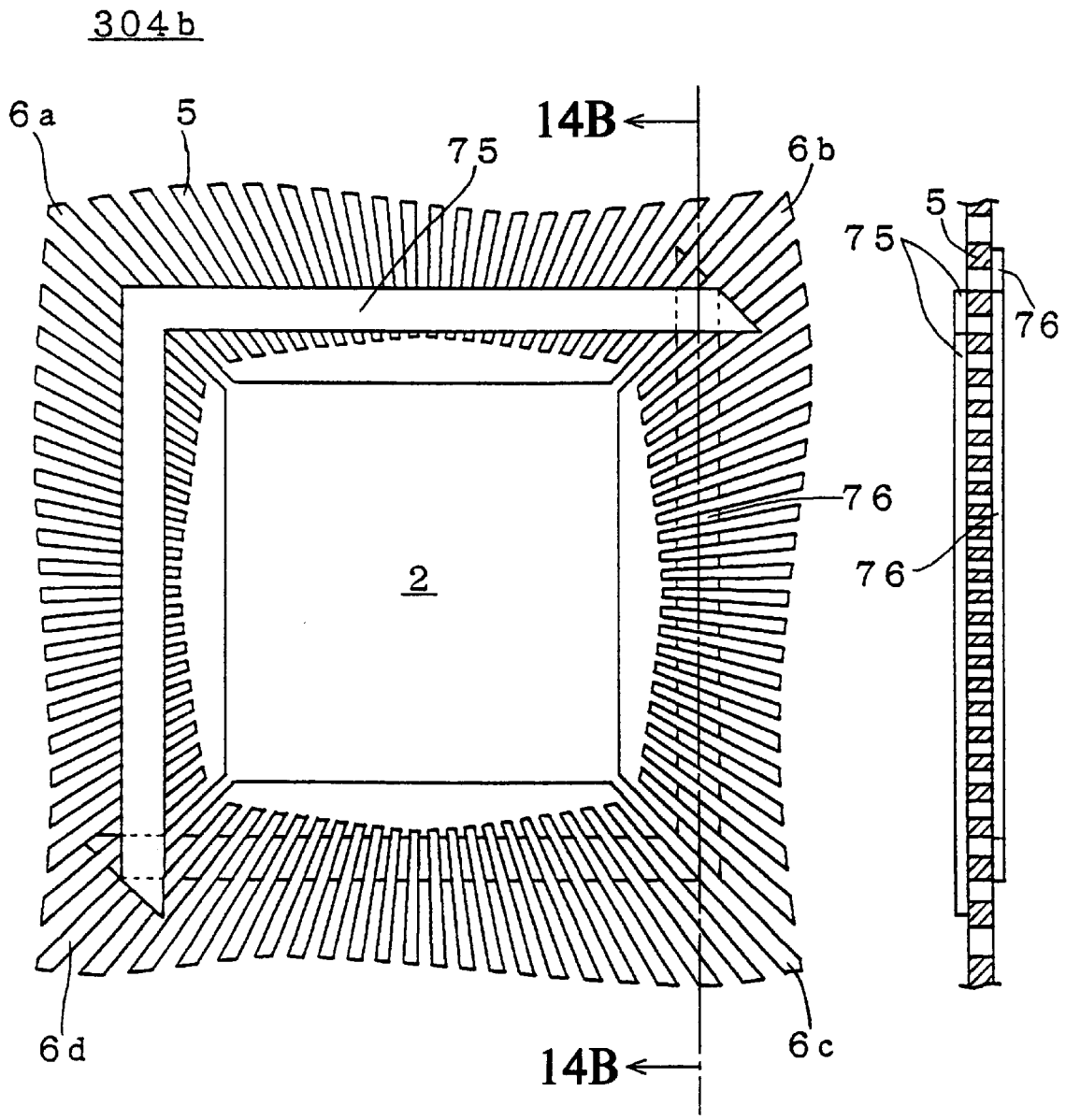
FIGS. 14A and 14B are a plan view and a section taken along the line 14A—14A and viewed from the direction of the arrow, respectively, showing a configuration of a leadframe in accordance with the fourth preferred embodiment of the present invention.
Figures 15A, 15B:
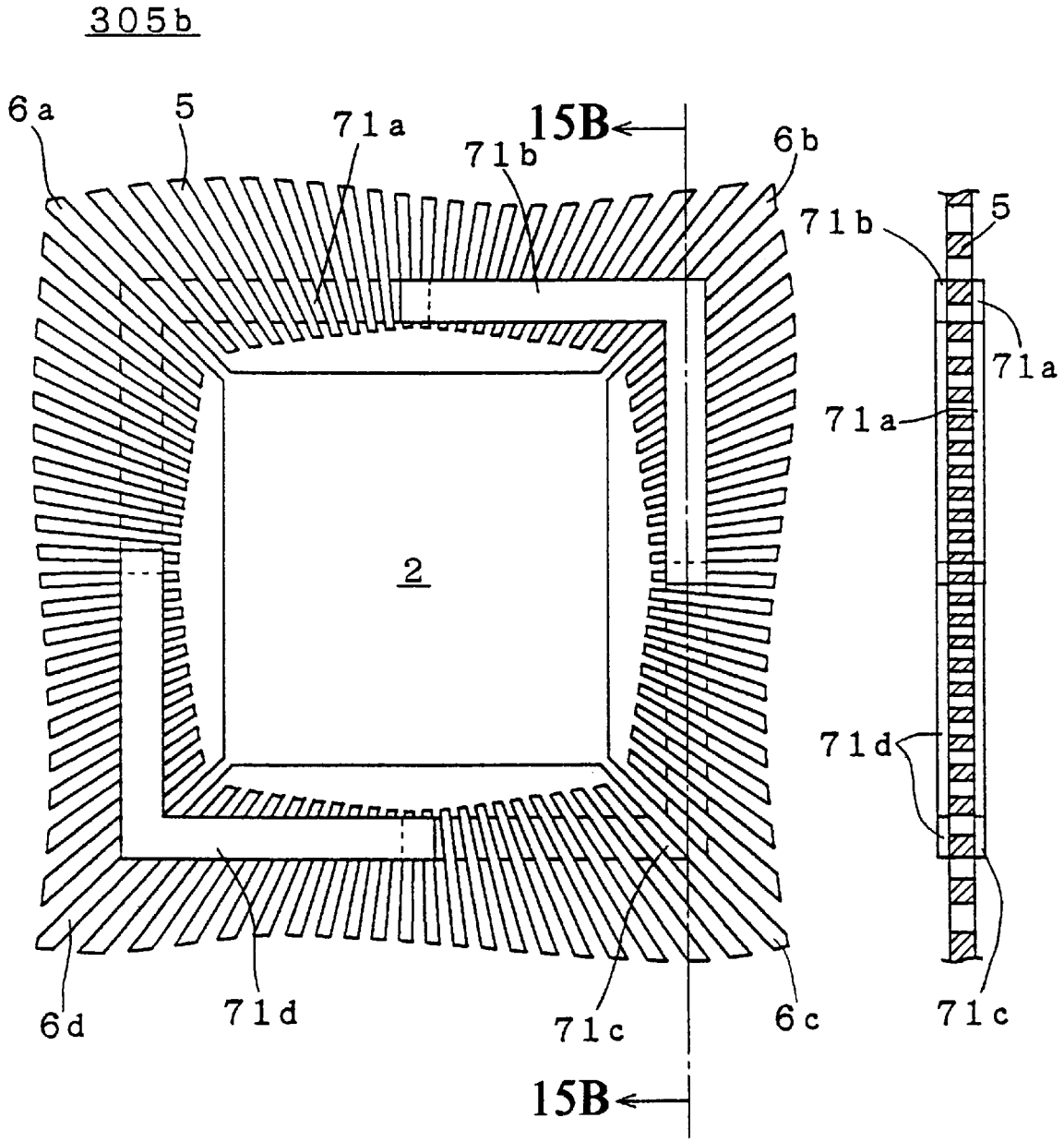
FIGS. 15A and 15B are a plan view and a section taken along the line 15A—15A and viewed from the direction of the arrow, respectively, showing a configuration of a leadframe in accordance with the fourth preferred embodiment of the present invention.
Figures 16A, 16B:
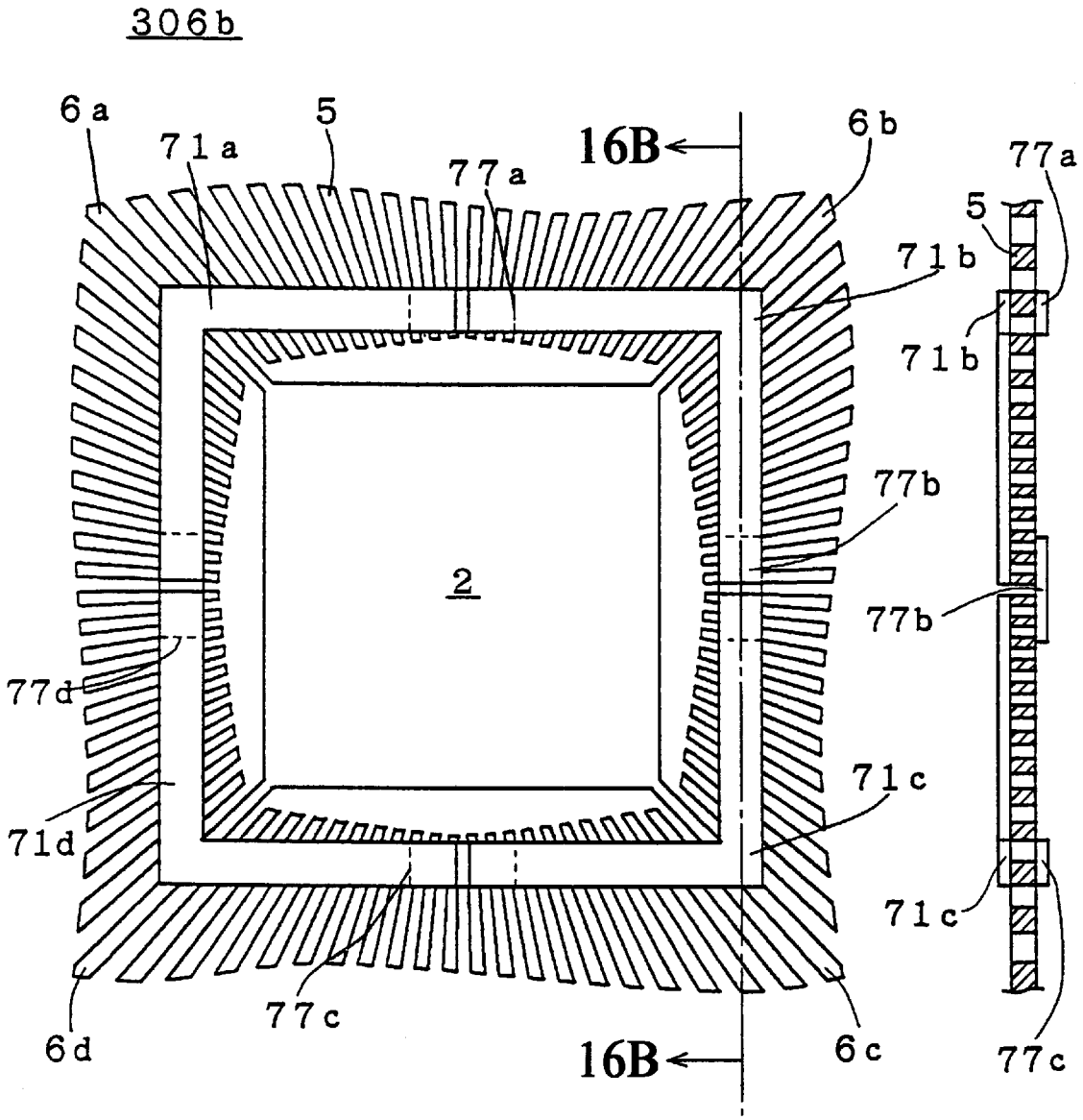
FIGS. 16A and 16B are a plan view and a section taken along the line 16A—16A and viewed from the direction of the arrow, respectively, showing a configuration of a leadframe in accordance with the fourth preferred embodiment of the present invention.
Figures 17A, 17B:
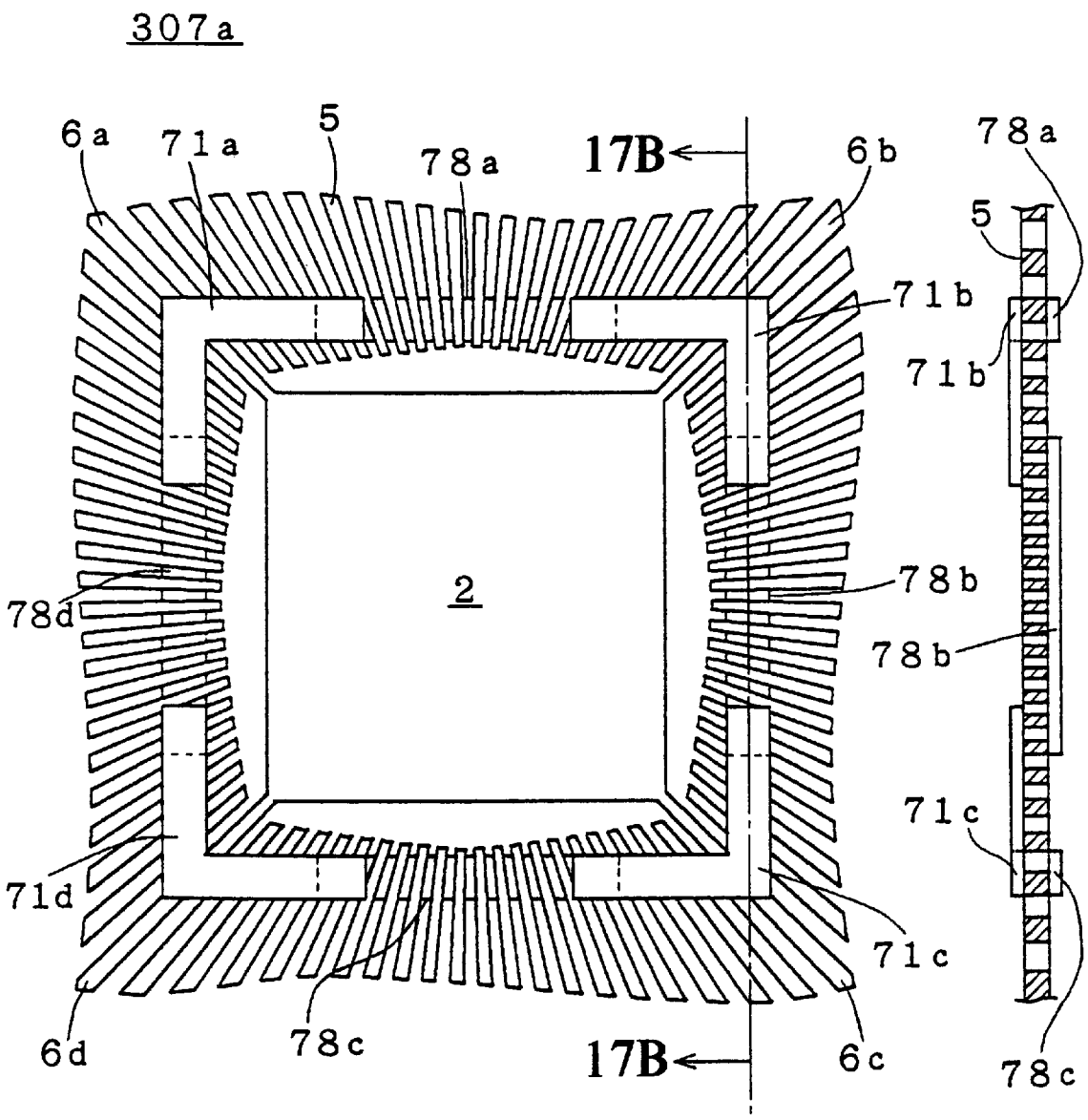
FIGS. 17A and 17B are a plan view and a section taken along the line 17A—17A and viewed from the direction of the arrow, respectively, showing a configuration of a leadframe in accordance with the fourth preferred embodiment of the present invention.
Figure 18:
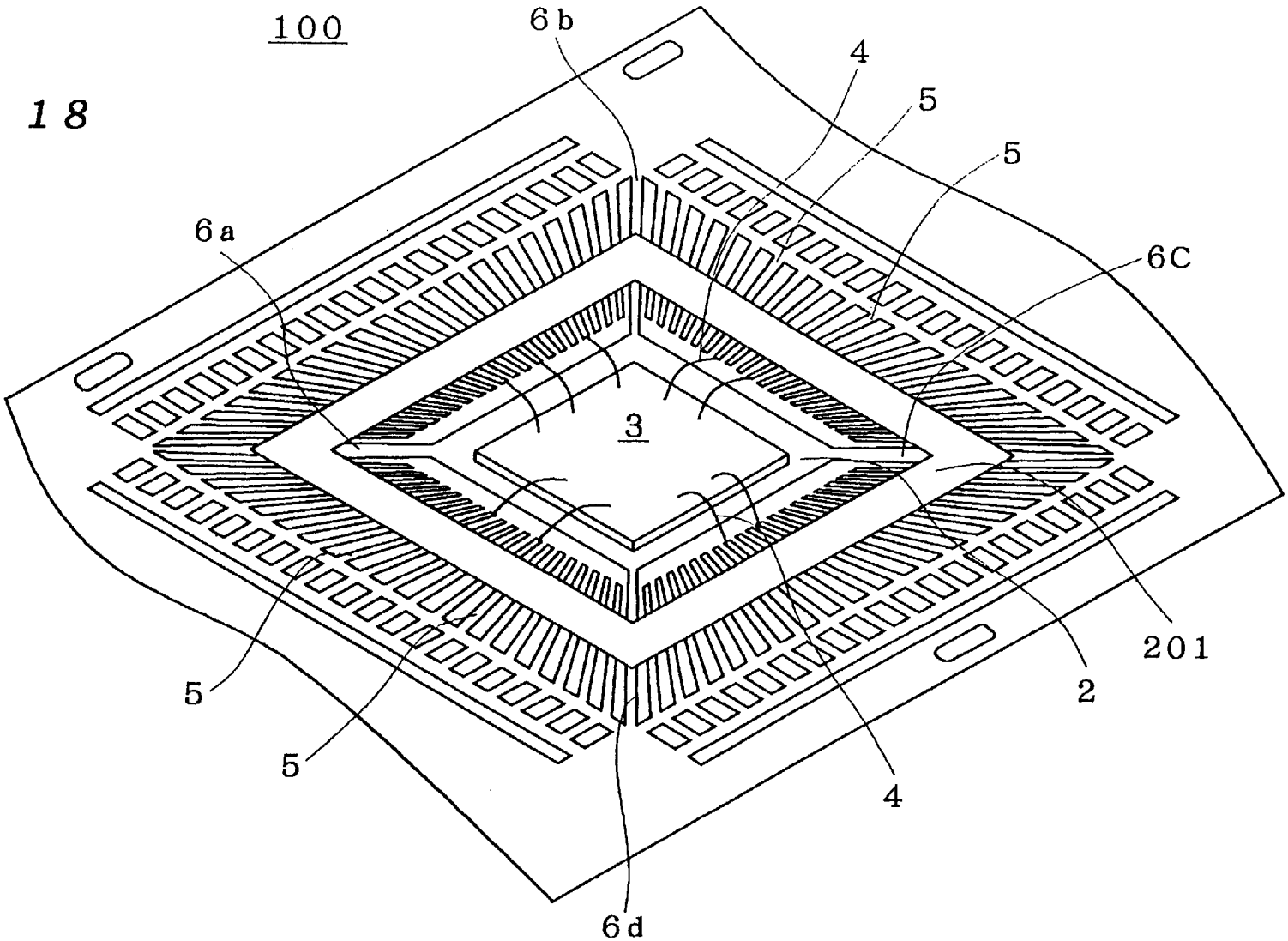
FIG. 18 is a perspective view showing a configuration of a first background art structure.
Figure 19:
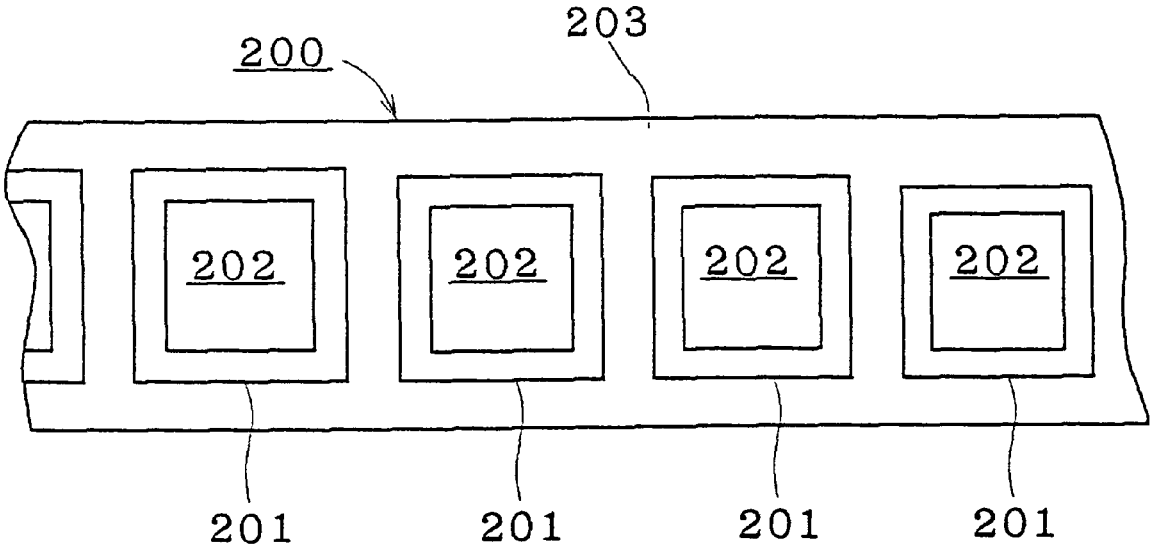
FIG. 19 is a plan view showing the first background art structure.
Figures 20A, 20B:
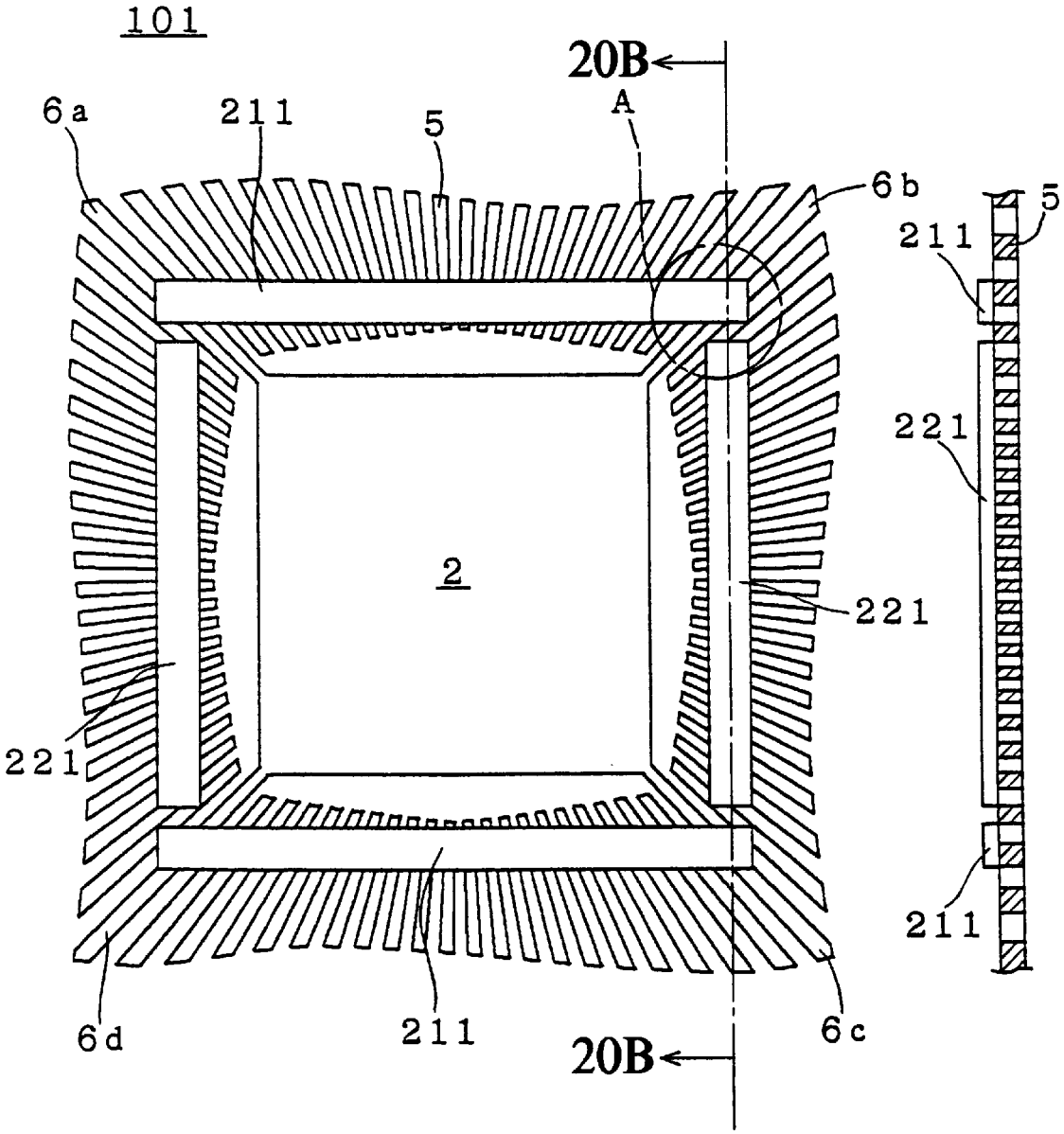
FIGS. 20A and 20B are a plan view and a section taken along the line 20A—20A and viewed from the direction of the arrow, respectively, showing a configuration of a second background art structure.
Figure 21:
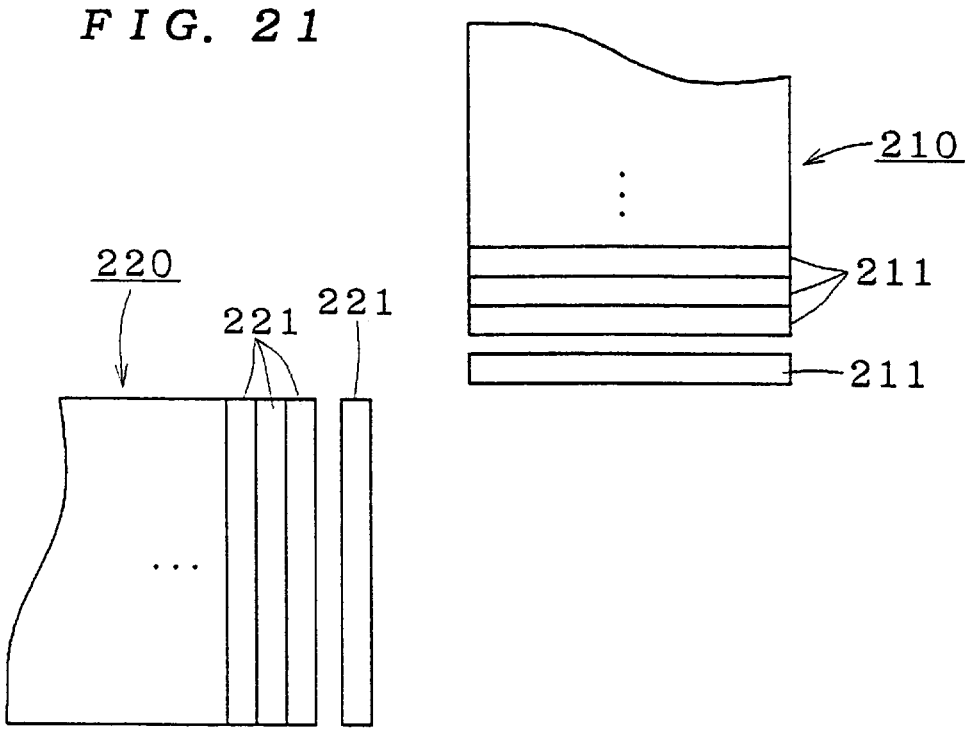
FIG. 21 is a plan view showing the second background art structure.
Figure 22:
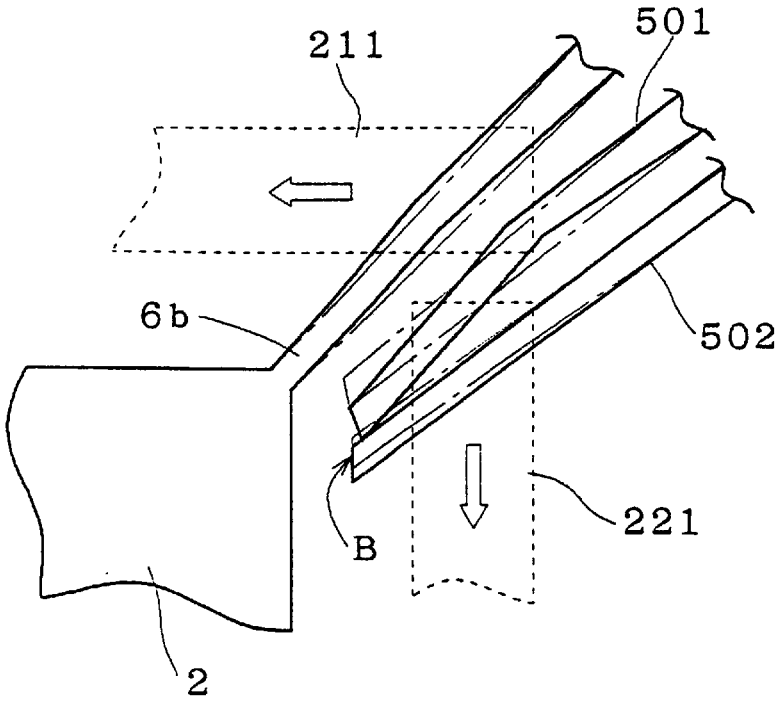
FIG. 22 is an enlarged view of an area A and its vicinity of FIG. 20A.
Figures 23A, 23B:
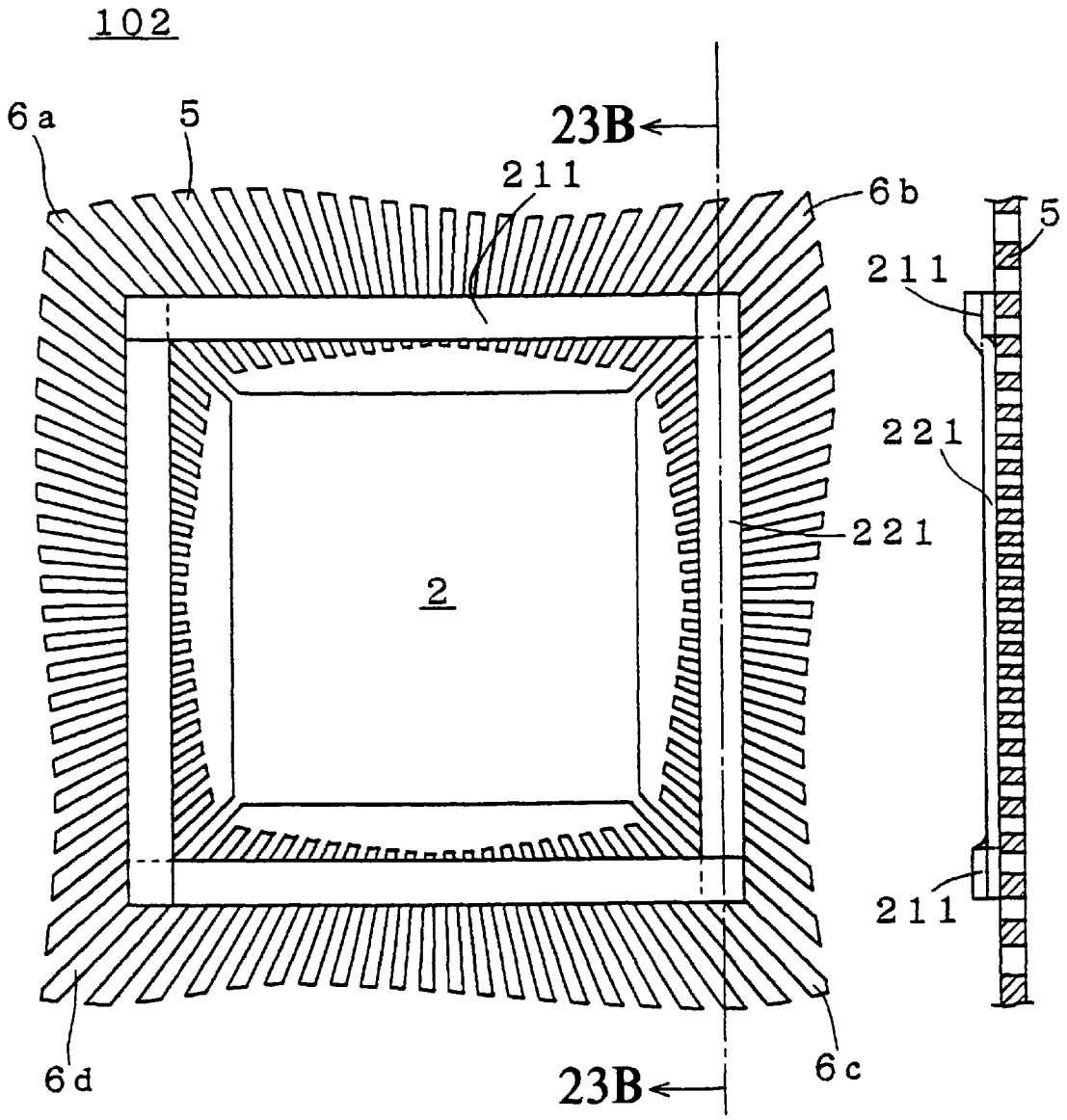
FIGS. 23A and 23B are a plan view and a section taken along the line 23A—23A and viewed from the direction of the arrow, respectively, showing a configuration of a third background art structure.

Naturally, the present invention can be applied to a still much larger leadframe by using longer strip-shaped support tapes (making K larger). FIG. 10A is plan view of a leadframe 307a in which strip-shaped support tapes 78a to 78d longer than the strip-shaped support tapes 77a to 77b are employed. FIG. 10B is a section taken along the line 10A—10A of FIG. 10A and viewed from the direction of the arrow In these figures, a rectangular ring-shaped pattern with sides each of which has a length L6 (>L5) is achieved.

As discussed in the first preferred embodiment, the L-shaped support tapes, such as the support tapes 71a to 71d, can be taken out of the material for support tape with higher efficiency. As discussed in the second background art structure also the strip-shaped support tapes such as the support tapes 77a to 77d and 78a to 78d can be taken out of the material for support tape with higher efficiency. Therefore, material efficiency of the support tape in the third preferred embodiment does not become worse than in the other preferred embodiments.

The Fourth Preferred Embodiment

As a variation of the above preferred embodiments, the support tapes to be overlapped may be alternately applied to a front surface and a back surface of tire leadframe. FIGS. 11A and 11B, 12A and 12B, 13A and 13B, 14A and 14B, 15A and 15B, 16A and 16B, and 17A and 17B show configurations of leadframes 301b to 307b as variations of the leadframes 301a to 307a shown in FIGS. 1A and 1B, 4A and 4B, 6A and 6B, 7A and 7B, 8A and 8B, 9A and 9B, and 10A and 10B, respectively. The figures with A suffixes are plan views and the figures with to suffixes are sections taken along the indicated lines of the corresponding figures with the A suffix.

These configurations achieve the same effect as discussed in the first to third preferred embodiments. Furthermore in each variation, there is no overlapped portions of two support tapes on the front surface, and therefore it becomes possible to suppress degradation in accuracy of resin-sealing.

While the invention has been shown and described in detail, the foregoing description is in all aspects illustrative and not restrictive. It is therefore understood that numerous modifications and variations can be devised without departing from the scope of the invention.

We claim:

1. A lead frame comprising:

a pad for supporting a semiconductor chip;

a plurality of inner leads extending radially toward said pad; and a plurality of L-shaped support tapes applied to said plurality of inner leads, said plurality of support tapes forming a ring shape, wherein one of said support tapes is applied to a front surface of said inner leads and another of said support tapes is applied to a back surface of said inner leads.

2. The lead frame of claim 1, including two support tapes.

3. The lead frame of claim 2, wherein said pad is substantially rectangular and is surrounded by said plurality of inner leads, said inner leads include four suspension leads supporting said pad at respective corners of said pad, and the overlapped ends of said two support tapes are respectively disposed on two of said suspension leads.

4. The lead frame of claim 2, wherein ends of one of said support tapes overlap ends of at least one other of said support tapes.

5. The lead frame of claim 4 wherein two of said suspension leads are interposed between the overlapped ends of said support tapes.

6. The lead frame of claim 1 wherein each of the ends of said support tapes has an edge oblique to other edges of said support tapes.

7. A lead frame including:

a pad for supporting a semiconductor chip;

a plurality of inner leads extending radially toward said pad; and four L-shaped support tapes applied to acid plurality of inner leads, said support tapes forming a ring shape, wherein ends of one of said support tapes overlap ends of at least one other of said support tapes.

8. The lead frame of claim 7 wherein said pad to substantially rectangular and is surrounded by said plurality of inner leads, said inns leads include four suspension leads supporting said pad at respective corners of said pad, and the [overlapped ends] *center portions* of said [two] *four L-shaped* support tapes are respectively disposed of four of said suspension leads.

9. The lead frame of claim 8 wherein:

*a* first pair of said support tapes are opposed to each other and a second pair of said support tapes are opposed to each other, said first pair of support tapes is applied to a front surface of said inner leads and said second pair of support tapes is applied to a back surface of acid inner leads, and inner leads are interposed between overlapped ends of said support tapes.

10. A lead frame comprising:

a pad for supporting a semiconductor chip;

a plurality of inner leads extending radially toward said pad; and a group of support tapes applied to said plurality of inner leads, said group of support tapes forming a ring shape, wherein said group of support tapes includes a plurality of first L-shaped support tapes and a plurality of second stripe-shaped support tapes, and ends of one of said plurality of first support tapes overlap ends of said plurality of second support tapes.

11. The lead frame of claim 10 wherein said plurality of first support tapes are applied to a front surface of said inner leads and said plurality of second support tapes are applied to a back surface of said inner leads, and inner leads are interposed between ends of said first support tapes overlapped with ends of said second support tapes.

12. A resin-sealed semiconductor device comprising a lead frame including:

a pad for supporting a semiconductor chip;

a plurality of inner leads extending radially toward said pad; and a plurality of L-shaped support tapes applied to said plurality of inner leads, said plurality of support tapes forming a ring shape, wherein one of said support tapes is applied to a front surface of said inner leads and another of said support tapes is applied to a back surface of said inner leads.

13. The resin-sealed semiconductor device of claim 12 including two of acid support tapes.

14. The resin-sealed semiconductor device of claim 13 wherein said pad is substantially rectangular and is surrounded by said plurality of inner leads, said inner leads include four suspension leads supporting said pad at respective corners of said pad, and the overlapped ends of said two support tapes are respectively disposed on two of said suspension leads.

15. The resin-sealed semiconductor device of claim 13 wherein ends of are of said support tapes overlap ends of at least are other of said support tapes.

16. The resin-sealed semiconductor device of claim 15 wherein two of said suspension leads are interposed between the overlapped ends of said support tapes.

17. The resin sealed semiconductor device of claim 12 wherein each of the ends of said support tapes has an edge oblique to other edges of said support tapes.

18. A resin-sealed semiconductor comprising a lead frame including:

a pad for supporting a semiconductor chip;

a plurality of inner leads extending radially toward said pad; and four L-shaped support tapes applied to said plurality of inner leads, acid support tapes forming a ring shape, wherein ends of one of said support tapes overlap ends of at least one other of said support tapes.

19. The resin sealed semiconductor device of claim 18 wherein said pad is substantially rectangular and is surrounded by said plurality of inner leads, said inner leads include four suspension leads supporting said pad at respective corners of said pad, and the [overlapped ends] *center portions* of said [two] *four L-shaped* support tapes are respectively disposed on four of said suspension leads.

20. The resin-sealed semiconductor device of claim 19 wherein:

a first pair of said support tapes are opposed to each other and a second pair of said support tapes are opposed to each other, said first pair of support tapes is applied to a front surface of said inner leads and said second pair of support tapes is applied to a back surface of said inner leads, and inner leads are interposed between overlapped ends of said support tapes.

21. A resin-sealed semiconductor device comprising a lead frame including:

a pad for supporting a semiconductor chip;

a plurality of inner leads extending radially toward said pad; and a group of support tapes applied to said plurality of inner leads, said group of support tapes forming a ring shape, wherein said group of support tapes includes a plurality of first L-shaped support tapes and a plurality of second stripe-shaped support tapes, and ends of one of said plurality of first support tapes overlap ends of said plurality of second support tapes.

22. The resin-sealed semiconductor device of claim 21 wherein said plurality of first support tapes are applied to a front surface of said inner leads and said plurality of second support tapes are applied to a back surface of said inner leads, and inner leads are interposed between ends of said first support tapes overlapped with ends of said support tapes.

* * * * *